(12) United States Patent
Ghinovker

(10) Patent No.: US 8,781,211 B2
(45) Date of Patent: Jul. 15, 2014

(54) ROTATIONAL MULTI-LAYER OVERLAY MARKS, APPARATUS, AND METHODS

(75) Inventor: Mark Ghinovker, Yokneam Ilit (IL)

(73) Assignee: KLA-Tencor Corporation, Milpitas, CA (US)

( * ) Notice: Subject to any disclaimer, the term of this patent is extended or adjusted under 35 U.S.C. 154(b) by 268 days.

(21) Appl. No.: 13/338,061

(22) Filed: Dec. 27, 2011

(65) Prior Publication Data
US 2013/0163852 A1    Jun. 27, 2013

Related U.S. Application Data

(60) Provisional application No. 61/579,346, filed on Dec. 22, 2011.

(51) Int. Cl.
*G06K 9/00* (2006.01)

(52) U.S. Cl.
USPC ........... 382/149; 382/141; 382/144; 382/145; 382/151

(58) Field of Classification Search
CPC .................. G03F 7/70633; G06T 2207/30148
USPC ........................... 382/149, 141, 145, 144, 151
See application file for complete search history.

(56) References Cited

U.S. PATENT DOCUMENTS

| | | | |
|---|---|---|---|
| 6,269,322 B1 | 7/2001 | Templeton et al. | |
| 7,541,201 B2 * | 6/2009 | Ghinovker | 438/16 |
| 7,684,038 B1 * | 3/2010 | Ghinovker et al. | 356/399 |
| 8,513,822 B1 * | 8/2013 | Ghinovker | 257/797 |
| 2002/0183989 A1 | 12/2002 | Chien et al. | |
| 2006/0197950 A1 * | 9/2006 | Smith et al. | 356/401 |
| 2007/0222088 A1 * | 9/2007 | Smith et al. | 257/797 |

FOREIGN PATENT DOCUMENTS

KR    10-2006-0118428 A    11/2006

OTHER PUBLICATIONS

International Application Serial No. PCT/US2012/071020, Search Report and Written Opinion mailed Apr. 29, 2013, 10 pgs.

* cited by examiner

*Primary Examiner* — Utpal Shah
(74) *Attorney, Agent, or Firm* — Kwan & Olynick LLP

(57) ABSTRACT

In one embodiment, a semiconductor target for determining overlay error, if any, between two or more successive layers of a substrate or between two or more separately generated patterns on a single layer of a substrate is disclosed. The target comprises at least a plurality of first structures that are invariant for a plurality of first rotation angles with respect to a first center of symmetry (COS) of the first structures and a plurality of second structures that are invariant for a plurality of second rotation angles with respect to a second COS of the second structures. The first rotation angles differ from the second rotation angles, and first structures and second structures are formed on different layers of the substrate or separately generated patterns on a same layer of the substrate.

23 Claims, 10 Drawing Sheets

ROTATIONAL MULTI-LAYER OVERLAY MARKS, APPARATUS, AND METHODS

BACKGROUND OF THE INVENTION

The present invention relates generally to overlay measurement techniques, which are used in semiconductor manufacturing processes. More specifically, the present invention relates to techniques for measuring alignment error between different layers or different patterns on the same layer of a semiconductor wafer stack.

CROSS-REFERENCE TO RELATED APPLICATIONS

This application claims benefit of prior U.S. Provisional Application No. 61/579,346 filed Dec. 22, 2011, titled "Rotational Multi-Layer Overlay Marks, Apparatus, and Methods" by Mark Ghinovker.

The measurement of overlay error for patterned layers on a wafer is one of the most critical process control techniques used in the manufacturing of integrated circuits and devices. Overlay accuracy generally pertains to the determination of how accurately a first patterned layer aligns with respect to a second patterned layer disposed above or below it and to the determination of how accurately a first pattern aligns with respect to a second pattern disposed on the same layer. Presently, overlay measurements are performed via test patterns that are printed together with layers of the wafer. The images of these test patterns are captured via an imaging tool and an analysis algorithm is used to calculate the relative displacement of the patterns from the captured images.

The most commonly used overlay target pattern is the "Box-in-Box" target, which includes a pair of concentric squares (or boxes) that are formed on successive layers of the wafer. The overlay error is generally determined by comparing the position of one square relative to another square.

To facilitate discussion, FIG. 1 is a top view of a typical "Box-in-Box" target 10. As shown, the target 10 includes an inner box 12 disposed within an open-centered outer box 14. The inner box 12 is printed on the top layer of the wafer while the outer box 14 is printed on the layer directly below the top layer of the wafer. As is generally well known, the overlay error between the two boxes, along the x-axis for example, is determined by calculating the locations of the edges of lines c1 and c2 of the outer box 14, and the edge locations of the lines c3 and c4 of the inner box 12. By way of example, the overlay can be found by $(c3+c4)/2-(c1+c2)/2$. Although not described, the overlay error between the two boxes along the y-axis may also be determined using the above technique.

Although this conventional overlay design has worked well, there are continuing efforts to provide improved techniques for determining or predicting overlay in device structures.

SUMMARY OF THE INVENTION

In one embodiment, a semiconductor target for determining overlay error, if any, between two or more successive layers of a substrate or between two or more separately generated patterns on a single layer of a substrate is disclosed. The target comprises at least a plurality of first structures that are invariant for a plurality of first rotation angles with respect to a first center of symmetry (COS) of the first structures and a plurality of second structures that are invariant for a plurality of second rotation angles with respect to a second COS of the second structures. The first rotation angles differ from the second rotation angles, and first structures and second structures are formed on different layers of the substrate or separately generated patterns on a same layer of the substrate.

In a specific implementation, the target further comprises a plurality of third structures that are invariant for a plurality of third rotation angles with respect to a third COS of the third structures, and wherein the third structures, the first structures, and the second structures are formed on different layers of the substrate or separately generated patterns on a same layer of the substrate. In a further aspect, the third rotation angles are the same as the first rotation angles. In another embodiment, the target further includes a plurality of dummy structures that fill areas around the target's first and second structures so as to substantially eliminate empty areas near the target. In a further aspect, the dummy structures have a density that causes the dummy structures to be measured as an unpatterned area so as to reduce cross-talk in determining overlay error in the target. In a specific implementation, the first layer structures each have a shape that differs from a shape of each of the second layer structures. In another embodiment, the first and second COS are designed to be the same when there is no significant overlay error between the first and second layer structures. In yet another embodiment, the first and second COS are designed to have a predefined offset when there is no significant overlay error between the first and second layer structures. In another aspect, the target is formed within an active die region of a wafer.

In another embodiment, the invention pertains to a method for determining overlay error between two or more successive layers of a substrate or between two or more separately generated patterns on a single layer of a substrate. The method comprises acquiring an image of a plurality of first structures that are designed to be invariant for a plurality of first rotation angles with respect to a first center of symmetry (COS) of the first structures and of a plurality of second structures that are designed to be invariant for a plurality of second rotation angles with respect to a second COS of the second structures is also acquired. The first rotation angles differ from the second rotation angles, and the first structures and the second structures are formed on different layers of the substrate or separately generated patterns on a same layer of the substrate. The first COS of the first structures is determined based on rotating the image by the first rotation angles and the second COS of the second structures is determined based on rotating the image by the second rotation angles. The determined first COS is compared to the second COS to determine whether there is an overlay error between the first and second structures that is out of specification.

In a specific implementation, the image is defined as a unrotated first image and determining the first COS comprises automatically placing a rotated first image of the unrotated image that has been rotated a first selected one of the first rotation angles with respect to an initial first COS. The rotated first image and the unrotated image are moved with respect to each other and different COS's until a best correlation and final COS is found between the first structures in the unrotated image and the rotated first image and the final COS is determined to be the first COS. Determining the second COS comprises automatically placing a rotated second image of the unrotated image that has been rotated a first selected one of the second rotation angles with respect to an initial second COS. The rotated first image and the unrotated image are moved with respect to each other and different COS's until a best correlation and final COS is found between the second structures in the unrotated image and the rotated second image, wherein the final COS is determined to be the second COS.

In a further embodiment, for each one of the first rotation angles and for the first structures, the operations for automatically placing and moving are repeated and the final COS's are averaged together. For each one of the second rotation angles and for the second structures, the operations for automatically placing and moving are repeated and the final COS's are averaged together. In another embodiment, the first and second structures are sized and positioned with respect to each other so as to substantially eliminate cross-talk and overlap of the unrotated image and the first and second rotated images when determining the COS for another one of the first or second structures. In yet another implementation, an overlay error is determined when the first COS differs from the second COS by more than a predetermined amount. In a further aspect, if an overlay error is found, a wafer upon which the first and second structures were formed is repaired. In another aspect, the method further comprises filtering a plurality of device structures from the first and second image prior to determining the first and second COS's.

In another embodiment, the invention pertains to a method of manufacturing a semiconductor target for determining overlay error, if any, between two or more successive layers of a substrate or between two or more separately generated patterns on a single layer of a substrate. The method includes forming a plurality of first structures of a target that are invariant for a plurality of first rotation angles with respect to a first center of symmetry (COS) of the first structures and forming a plurality of second structures the target that are invariant for a plurality of second rotation angles with respect to a second COS of the second structures. The first rotation angles differ from the second rotation angles, and the first structures and the second structures are formed on different layers of the substrate or separately generated patterns on a same layer of the substrate.

In another embodiment, the invention is directed towards an apparatus for determining overlay error between two or more successive layers of a substrate or between two or more separately generated patterns on a single layer of a substrate. The apparatus comprises an optical assembly for acquiring an image of a plurality of first structures that are designed to be invariant for a plurality of first rotation angles with respect to a first center of symmetry (COS) of the first structures and of a plurality of second structures that are designed to be invariant for a plurality of second rotation angles with respect to a second COS of the second structures, wherein the first rotation angles differ from the second rotation angles and wherein the first structures and the second structures are formed on different layers of the substrate or separately generated patterns on a same layer of the substrate. The apparatus further comprises at least one memory and at least one processor, wherein the at least one memory and processor are configured for performing the following operations: (i) determining the first COS of the first structures based on rotating the image by the first rotation angles and determining the second COS of the second structures based on rotating the image by the second rotation angles, (ii) comparing the determined first and second COS to determine whether there is an overlay error between the first and second structures that is out of specification.

In a specific implementation, the image is defined as an unrotated image and determining the first COS comprises: (i) automatically placing a rotated first image of the unrotated image that has been rotated a selected one of the first rotation angles with respect to an initial first COS, and (ii) moving the rotated first image and the unrotated image with respect to each other and different COS's until a best correlation and final COS is found between the first structures in the unrotated image and the rotated first image, wherein the final COS is determined to be the first COS. Determining the second COS comprises (i) automatically placing a rotated second image of the unrotated image that has been rotated a selected one of the second rotation angles with respect to an initial second COS, and (ii) moving the rotated second image and the unrotated image with respect to each other and different COS's until a best correlation and final COS is found between the second structures in the unrotated image and the rotated second image, wherein the final COS is determined to be the second COS. In a further aspect, the at least one memory and processor are further configured for performing the following operations: (i) for each one of the first rotation angles and for the first structures, repeating the operations for automatically placing and moving and averaging the final COS's together, and (ii) for each one of the second rotation angles and for the second structures, repeating the operations for automatically placing and moving and averaging the final COS's together.

These and other features of the present invention will be presented in more detail in the following specification of embodiments of the invention and the accompanying figures which illustrate by way of example the principles of the invention.

DETAILED DESCRIPTION OF SPECIFIC EMBODIMENTS

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Figure 1:
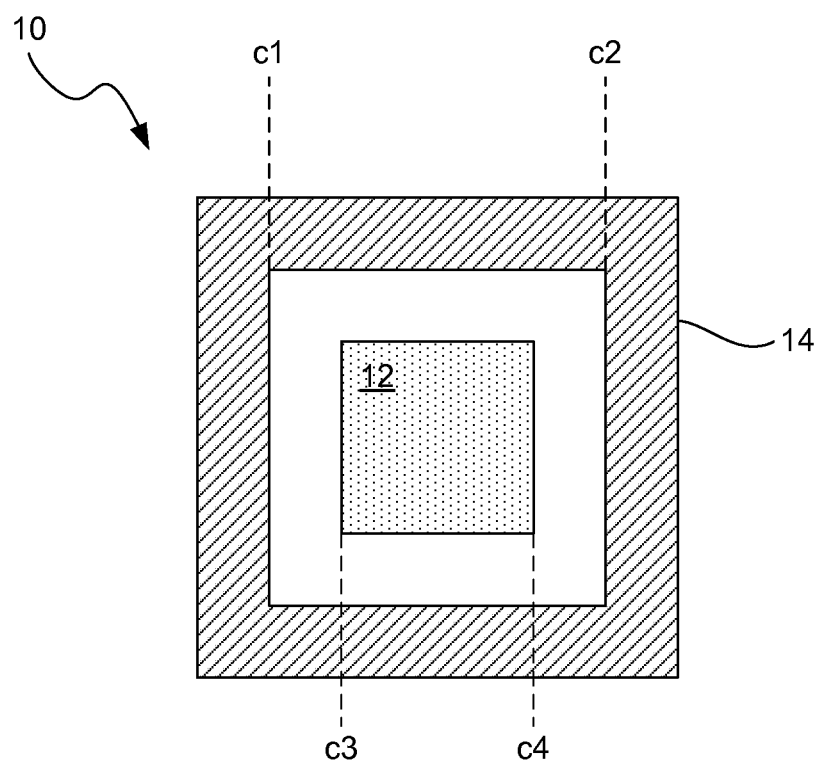
FIG. 1 is a top plan view of a box-in-box type overlay mark.
Figure 2:
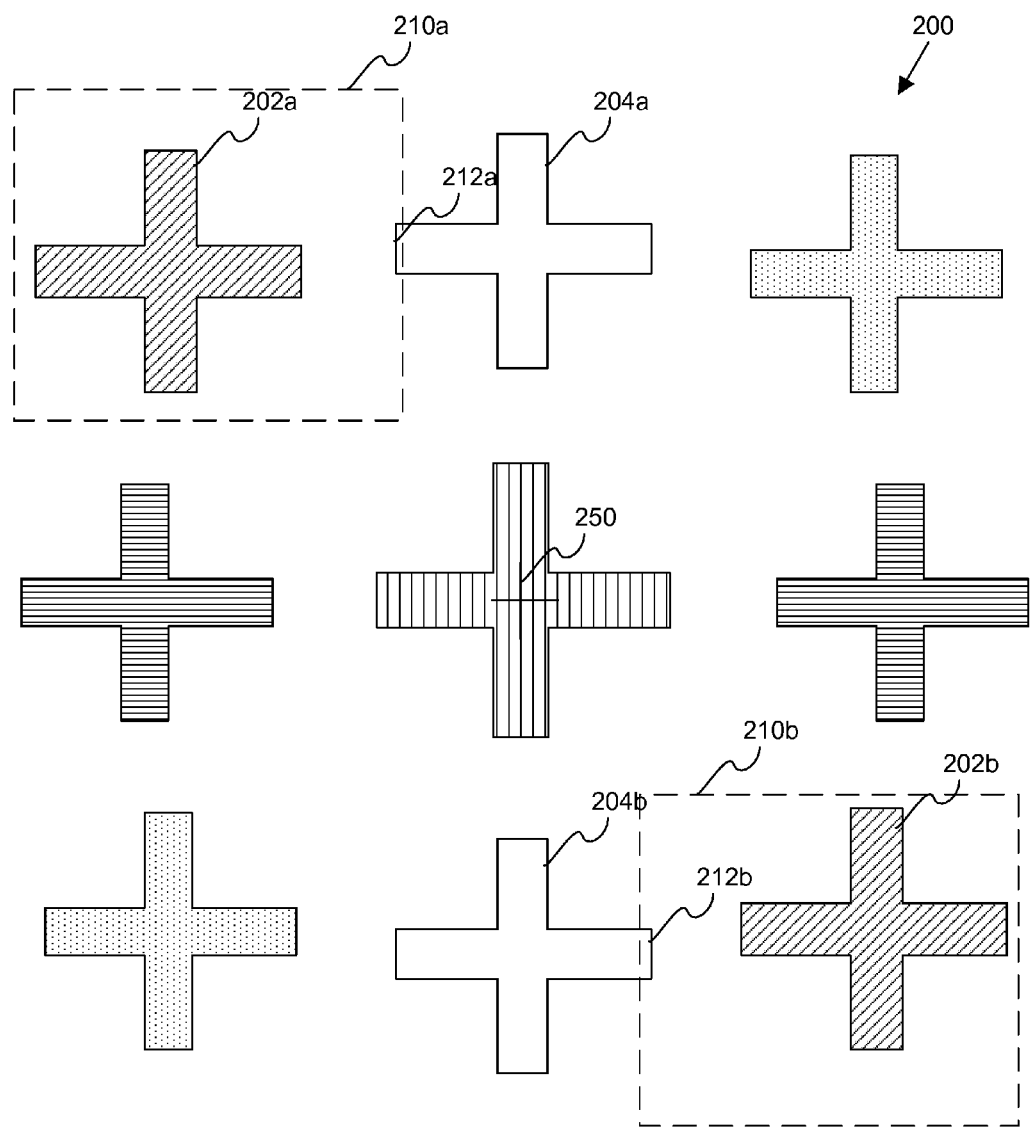
FIG. 2 illustrates an overlay having 180° rotational symmetry for each set of structures in each layer.

A typical overlay mark may include inner and outer layer features that are symmetric with respect to 180° rotation around a center of symmetry (COS) by design. FIG. 2 illustrates an overlay target 200 having 180° rotational symmetry for each set of structures in each layer. As shown, the overlay target 200 may include a plurality of structure pairs for the different material layers, as well as a center structure for at least one material layer. For example, the overlay mark 200 includes structure pairs 202a and 202b for a first material, structure pairs 204a and 204b for a second layer, and center structure 250 for a third layer. The overlay target may also contain any suitable number of structure pairs and/or center structures for any suitable number of layers.

When an overlay error is present within a target, the COS of a first layer of structures of such target is typically shifted from the COS of a second layer of structures. This shift is called the overlay error. Thus, the COS of the structures from each layer can be compared to the COS of the structures of each other layer to determine whether there is an overlay error. For example, the overlay error in a target may be determined based on a priori knowledge that such target is designed to have structures in each layer that have a 180° rotational symmetry about a same COS. Any shift between the COS's of the first and second layer structures may be imaged and measured as an overlay error. In alternative embodiments, the targets may be arranged so that the first and second structures have a COS with a known offset, as well as having a same rotational symmetry. In this case, if the shift does not match the known offset, the amount of variance from the offset corresponds to the overlay error.

A target that uses the same rotational symmetry for each layer may present problems for determining overlay (also referred to as misalignment) between the COS's of the different layers. A typical process for determining overlay error may include forming a region of interest (ROI) around each structure of each layer pair, where each pair is designed to be symmetrical at a predefined angle around a COS. In the illustrated example of FIG. 2, a ROI 210a is formed around structure 202a of the first layer, while a ROI 210b is formed around structure 202b of the same first layer. However, each ROI of such first layer, besides including a first layer structure, may also include a portion of an adjacent structure from another second layer. In the illustrated example, ROI 210a encompasses both the intended first layer structure 202a, as well as unintentionally encompassing structure portion 212a from the second layer structure 204a. Likewise, ROI 210b includes the intended or first layer structure 202b, as well as a sub-structure 212b of the second layer structure 204b.

Figure 3:
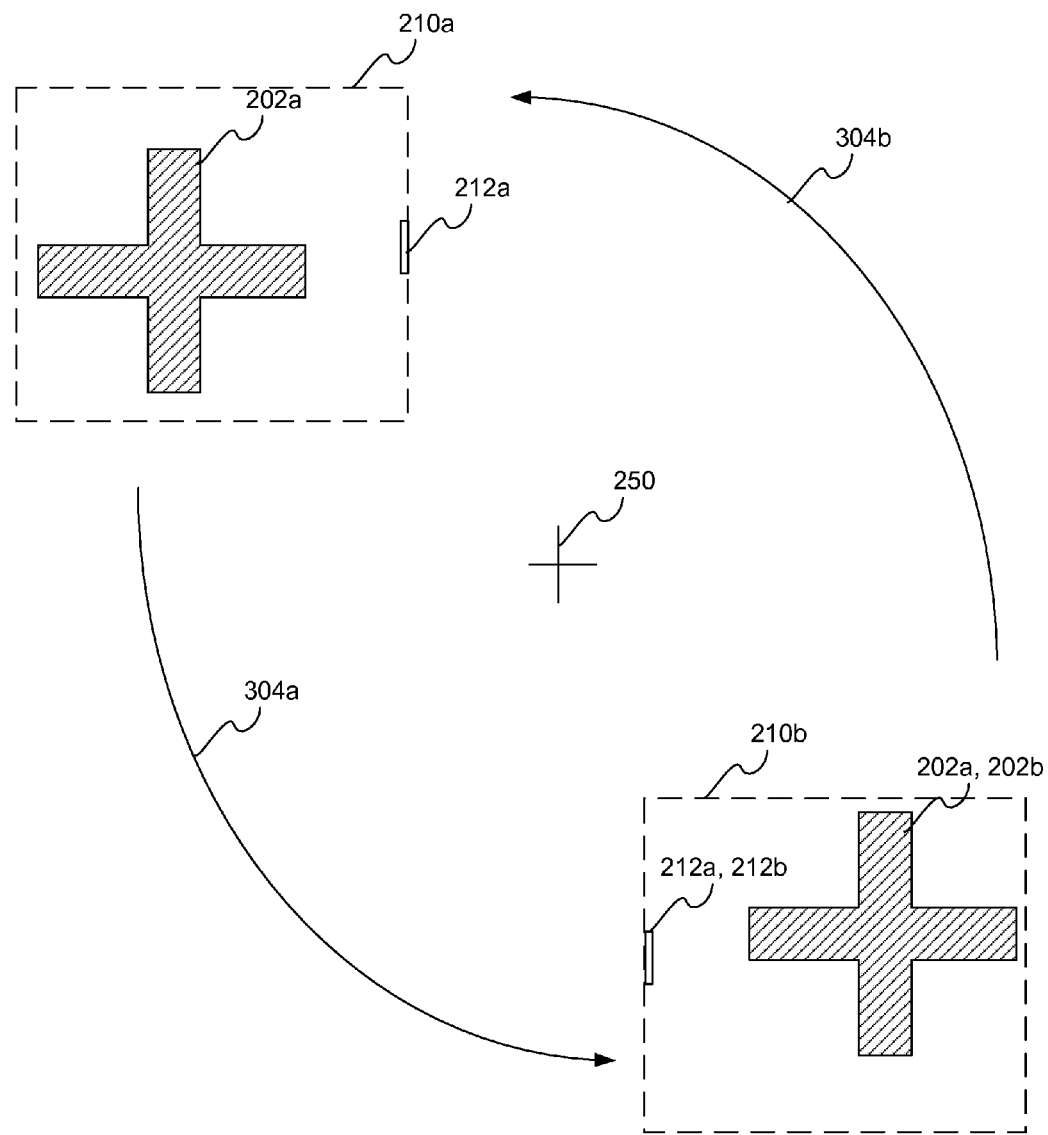
FIG. 3 diagrammatically illustrates rotating an image of the structures of one layer in two regions of interest at a 180° angle and superimposing such rotated image onto the unrotated image of such structures.

FIG. 3 diagrammatically illustrates rotating an image of the structures of one layer in the ROI's 210a and 202b at a 180° angle and superimposing such rotated image onto the unrotated image of the target 200 of FIG. 2. Prior to rotation of the image, the structures of ROI 210a are within the upper left corner in the unrotated image. These structures of ROI 210a can then be rotated (direction 304a) 180° from this upper left corner to the bottom right corner so that the ROI structures 210a of the rotated image are positioned over the ROI structures 210b of the unrotated image. Likewise, the ROI structures 210b would also be rotated (direction 304b) 180° from the lower right corner to the upper left corner in the rotated image so that such rotated structures 210b are placed over the ROI structures 210a of the unrotated image.

The COS, about which ROI's structures are rotated, is adjusted until the best correlation between the structures of the rotated ROI structures and the unrotated ROI structures is found. The position that results in the best correlation is determined to be the COS, e.g., 250, for that particular layer. However, the sub-structures 212a and 212b, which are inadvertently included within their respective ROI's, can adversely affect the determination of the COS 250 for a particular layer that is being analyzed. That is, the information from the second layer structures, for which COS is not being found in the present example, may adversely affect the overall information that is being processed to determine the COS for the first layer structures.

The extraneous information from another layer's sub-structures is referred to as cross-talk. Such cross-talk can impact overlay metrology accuracy and performance, and even result in the overlay measurements being unusable. In order to avoid this problem, structures belonging to different layers can be separated by exclusion zones, which do not contain information about either of the layers measured, as well as any external information, so as to reduce the likelihood of cross-talk being present within a ROI formed around such structures. However, exclusion zones tend to consume expensive real estate on the wafer and prevent overlay marks from being shrunk to sizes suitable for in-die overlay metrology.

In certain embodiments of the present invention, at least some of the different layers of the overlay mark have a different set of rotation angles for structure invariance for different layer structures (or different separately generated structures). Having different rotation angles for structure invariance allows the overlay metrology to better withstand correlation cross-talk as described further herein. A reduction or elimination of the effects from cross-talk can then result in the removal or shrinking of exclusion zones so as to reduce the overall size of the overlay mark and improve real estate utilization inside the mark area.

Figure 4:
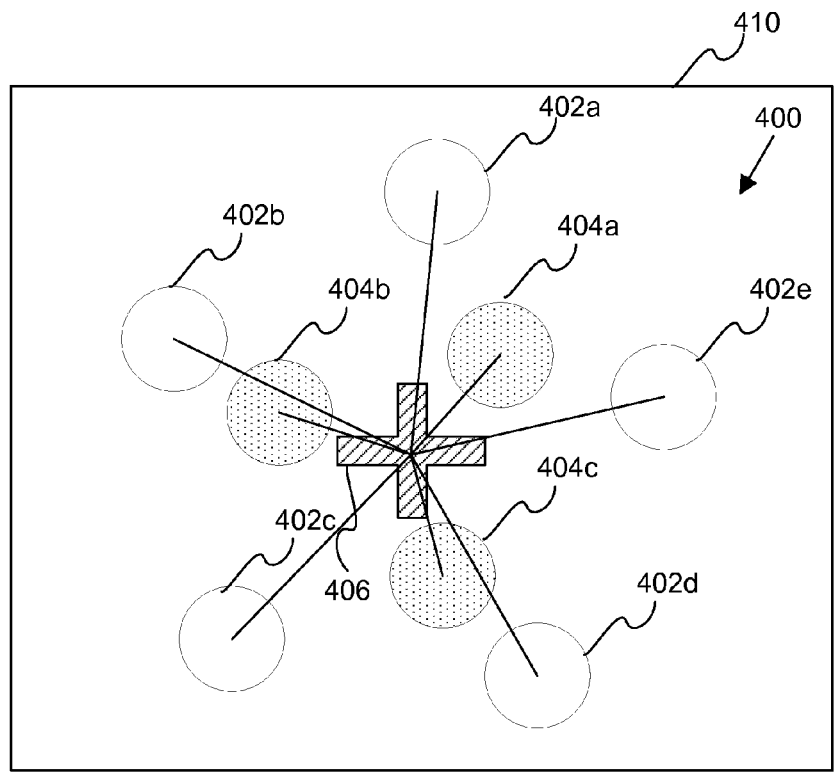
FIG. 4 is a diagrammatic representation of an overlay mark in accordance with one embodiment of the present invention.

FIG. 4 is a diagrammatic representation of an overlay mark 400 in accordance with one embodiment of the present invention. As shown, the mark 400 includes a plurality of structures 402a-402e for a first layer, a plurality of structures 404a-404c for a second layer, and a single structure 406 for a third layer. Unlike traditional overlay marks, where the structures in all the layers are designed to be invariant at a same 180° rotation, this mark 400 is designed to have different rotation angles at which the different layer structures are invariant. For example, the structures in the first layer are invariant at 72°, 144°, 216° and 288°. The structures of the second layer are invariant to 120° and 240° rotations. Finally, the third layer structure is invariant to 90°, 180°, and 270° rotation.

Figure 5:
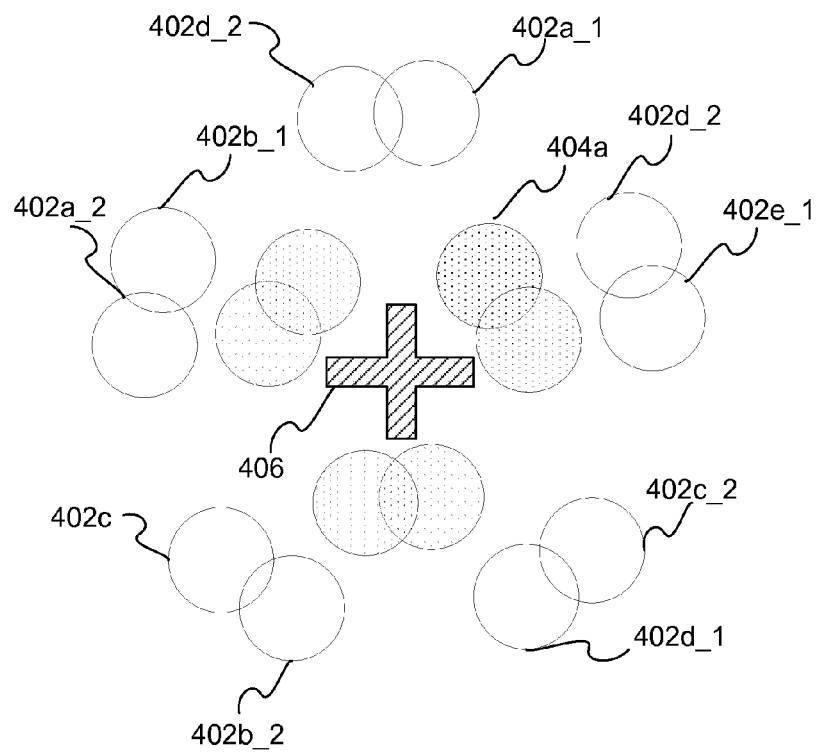
FIG. 5 illustrates a single region of interest process for determining the center of symmetry (COS) for the center structure on the third layer of the target of FIG. 4 in accordance with one implementation of the present invention.

When different rotation angles are used for the structure invariance for different layers of an overlay target, a single region of interest (ROI) 410 may be used to encompass all of the structures of the different layers as a whole. Of course, measurements may also be performed using separate ROI's. FIG. 5 illustrates a single ROI process for determining the rotational center of symmetry (COS) for the center structure 406 on the third layer of the target 400 of FIG. 4 in accordance with one implementation of the present invention.

Any suitable process can then be implemented for determining whether there is an overlay error. In one implementation, the rotation COS's for the different layer structures are determined and compared using any suitable techniques. The COS's may be found by analyzing rotated and unrotated images of the different layer structures with respect to one another. For instance, the COS for the third layer structure may be found by locating a maximum correlation between the structures in an image of the original, unrotated ROI and the structures in the same ROI after rotating the image by 90°, 180° or 270°. As shown, the rotated third layer structure 406 lies exactly on top of the unrotated third layer structure 406 at maximum correlation.

However, the first and second layer structures do not correlate well before and after rotation. As illustrated, the structures labeled as 402a_1-402e_1 represent the first layer structures before the rotation, while the structures denoted as 402a_2-402e_2 represent the same first layer structures after rotation by 90°, 180° or 270°. The correlation for these first and second layer structures before and after rotation is minimal. Accordingly, since only the single structure 406 remains invariant (by design) to this rotation, the structures 402a-402e and 404a-404c do not correlate well at the 90°, 180° or 270° angles, causing these other structures to have a minor contribution to the correlation for determining a rotation COS. As a result, the COS for the third layer can be determined more accurately.

Figure 6:
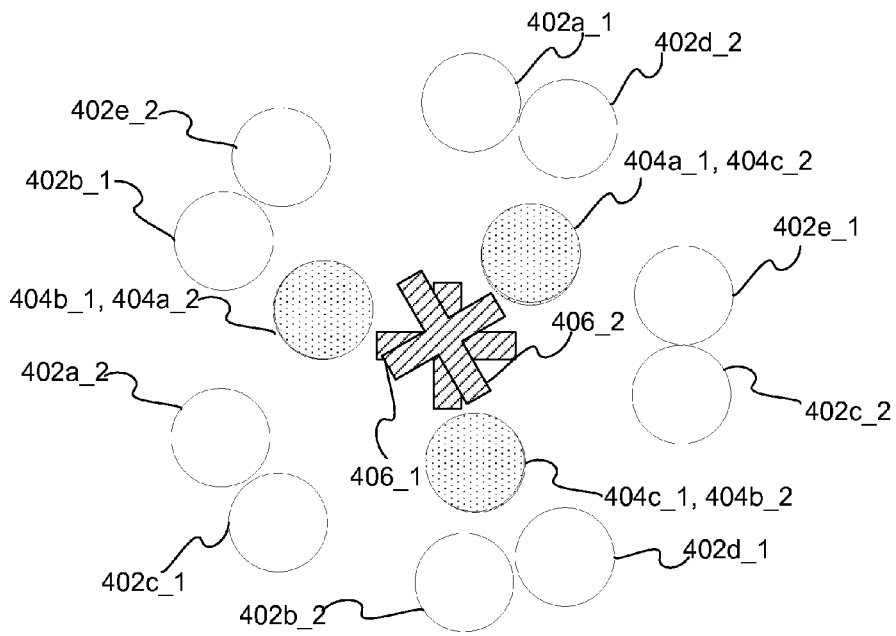
FIG. 6 illustrates strong correlation of the second layer structures of the target of FIG. 2 for rotation angles of 120° or 240° in accordance with one example embodiment.

The COS may similarly be determined for the second layer structures. FIG. 6 illustrates strong correlation of the second layer structures 404a-404c for a rotation angle of 120° or 240° in accordance with one example embodiment. For this particular layer, the rotated structures 404a_2-404c_2 correlate well with the unrotated structures 404a_1-404c_1. In contrast, the rotated third layer structure 406_2 does not correlate well with its unrotated counterpart 406_1. Likewise the rotated first layer structures 402a_2-402e_2 do not correlate well with the unrotated counterpart first layer structures 402a_1-402e_1. Thus, the first and third layer structures do no contribute significantly to the determination of the COS for the second layer structures. The COS of the second layer structure can be found by locating the maximal correlation of the original ROI and the same ROI rotated by a rotation angle of 120° or 240°.

Figure 7:
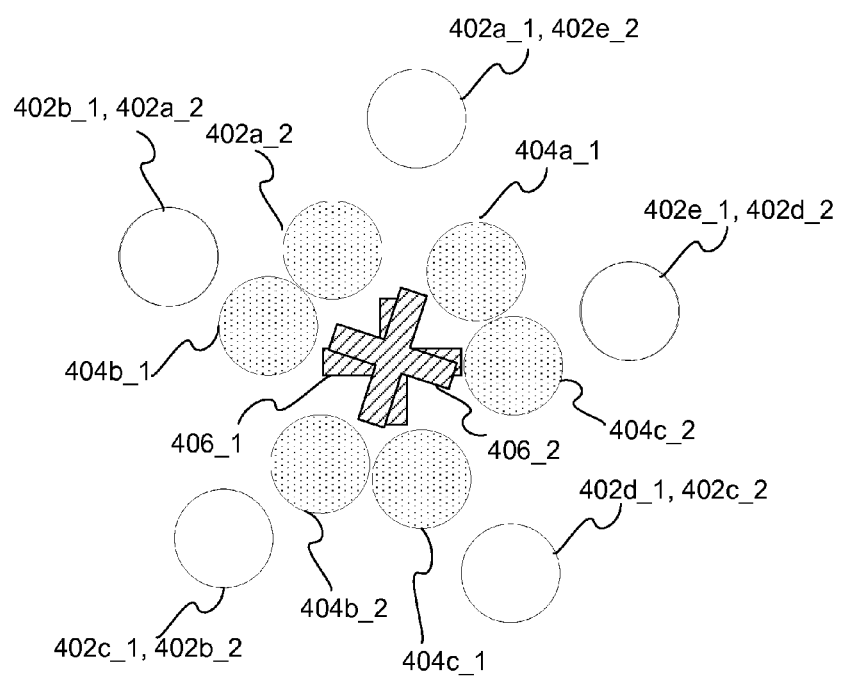
FIG. 7 illustrates strong correlation between the rotated first layer structures and the counterpart unrotated first layer structures of the target of FIG. 2 in accordance with one embodiment.

The COS can then be determined for the first layer structures. FIG. 7 illustrates strong correlation between the rotated first layer structures 402a_2-402e_2 and the counterpart unrotated first layer structures 402a_1-402e_1 of the target of FIG. 2 in accordance with one embodiment. However, the rotated second and third layer structures are variant with the unrotated second and third layer structures, respectively. Accordingly, the second and third layer structures do not contribute significantly to the determination of the COS for the first layer structures. The COS of the first layer structure can be found by locating the maximal correlation of the original ROI and the same ROI rotated by a rotation angle of 72°, 144°, 216° or 288°.

Although the above target examples are described herein with three different layers, an overlay target may include any suitable number of layer structures, such as two layer structures or more than 3 layer structures. Additionally, the structures for the different layers may have the same or different shapes. The structures for each layer are described as having a rotational symmetry with respect to a particular COS. Additionally, each feature has at least a same degree of rotational symmetry as the layer. For example, if the layer has 3-fold symmetry (i.e., rotationally invariant at 3 rotational positions), each feature has at least a 3-fold symmetry. Each feature may also have a higher degree of rotational symmetry than the layer. For example, the target may include structures on different layers (or separately generated areas of the wafer) that are invariant at 6 rotational angles while the layer has 3-fold symmetry. For instance, although the first and second layers of the above examples have 5-fold symmetry (target 402a-e) and 3-fold symmetry (target 404a-c), each circular feature of these two layers is invariant at any rotation.

Although target structures are described herein as having differing rotation angles for the different layers, some layers can share rotational symmetry. That is, a target may include layers having different rotational symmetry angles, as well as other layers that have the same rotational symmetry. When two layers share a same rotational symmetry, careful placement and sizing of the structures can be selected to reduce cross-talk for determining overlay of the layers that have the same rotational angles. ROI's may also be formed around the individual layer structures. In another embodiment, the target includes structures having rotational symmetry angles other than 180°, and perhaps also excluding 90° and 270° rotational symmetry for the target. For instance, a target may include only the first and second layer features 402a-e and 404a-c, and not the third layer feature 406, of FIG. 4.

Figure 8:
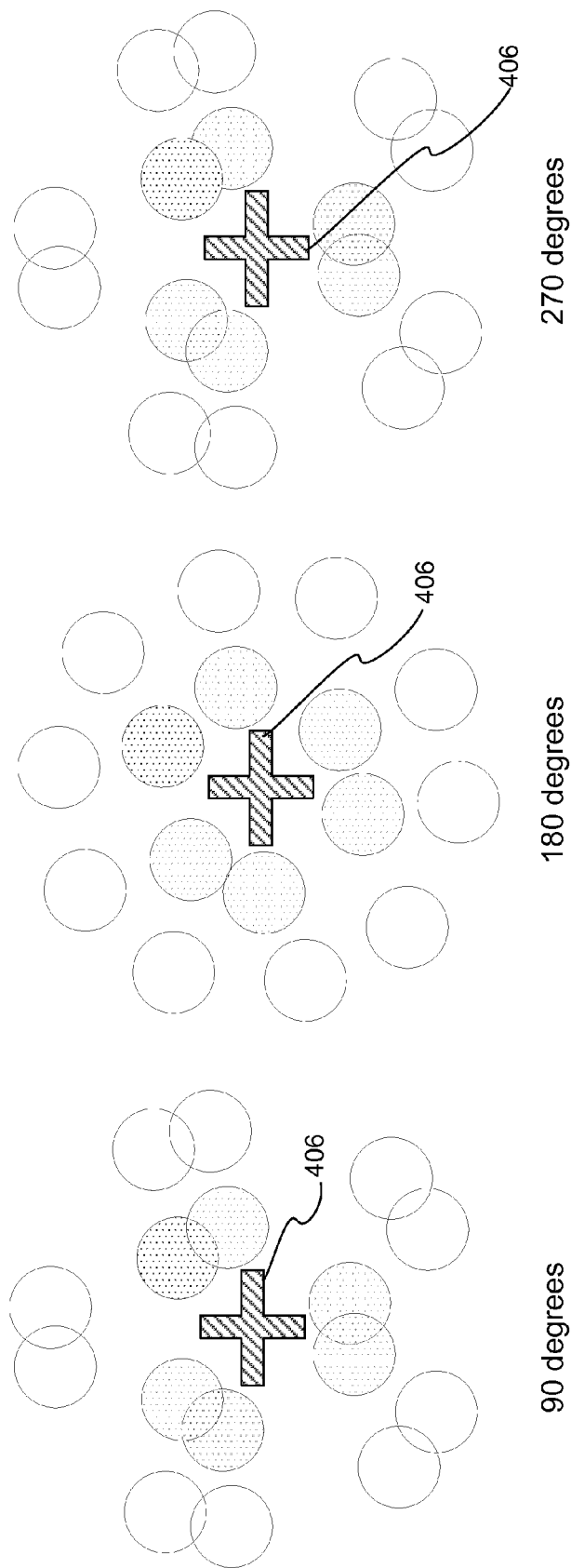
FIG. 8 illustrates a process for averaging the results of determining COS for the third layer structures of FIG. 2 at rotation angles of 90°, 180° or 270°.
Figure 9:
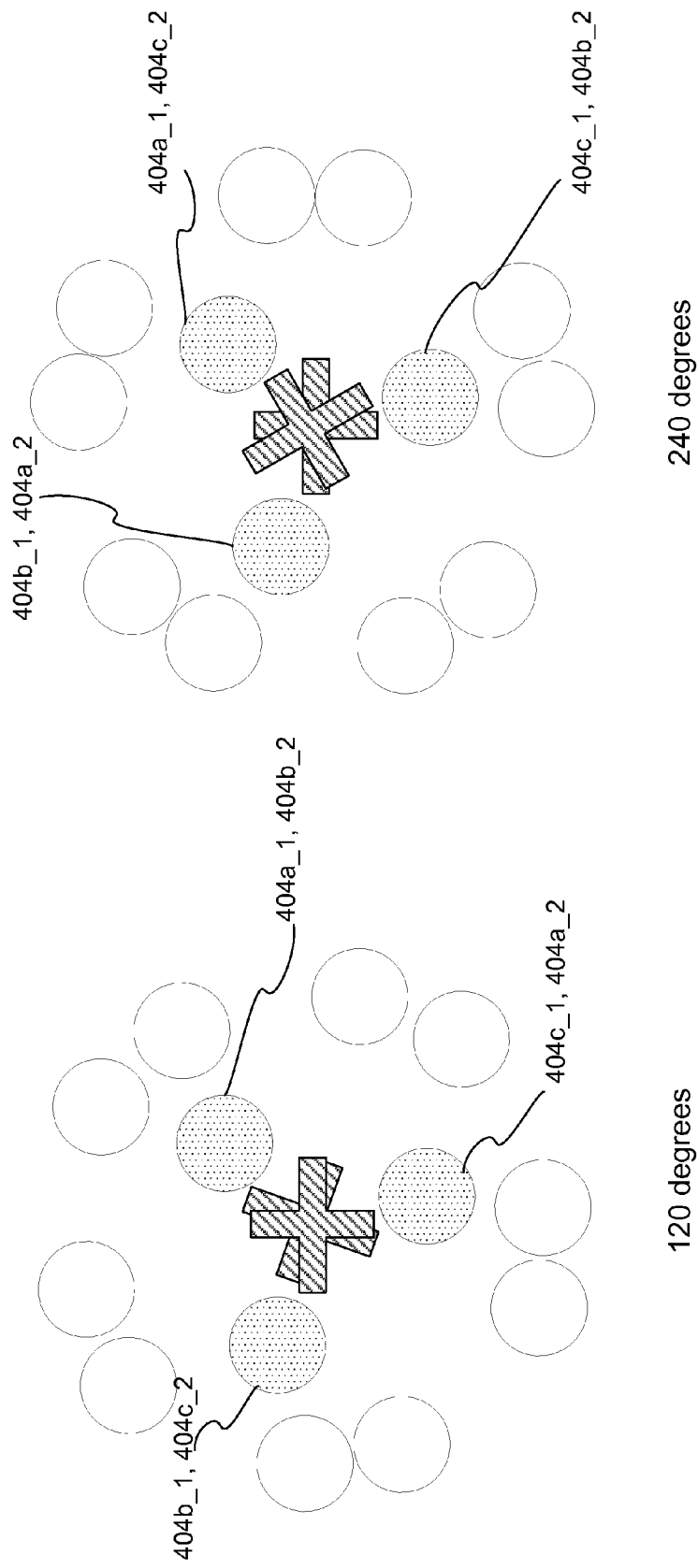
FIG. 9 illustrates a process for averaging the results for determining COS for the second layer structures of FIG. 2 at 120° and 240°.
Figure 10:
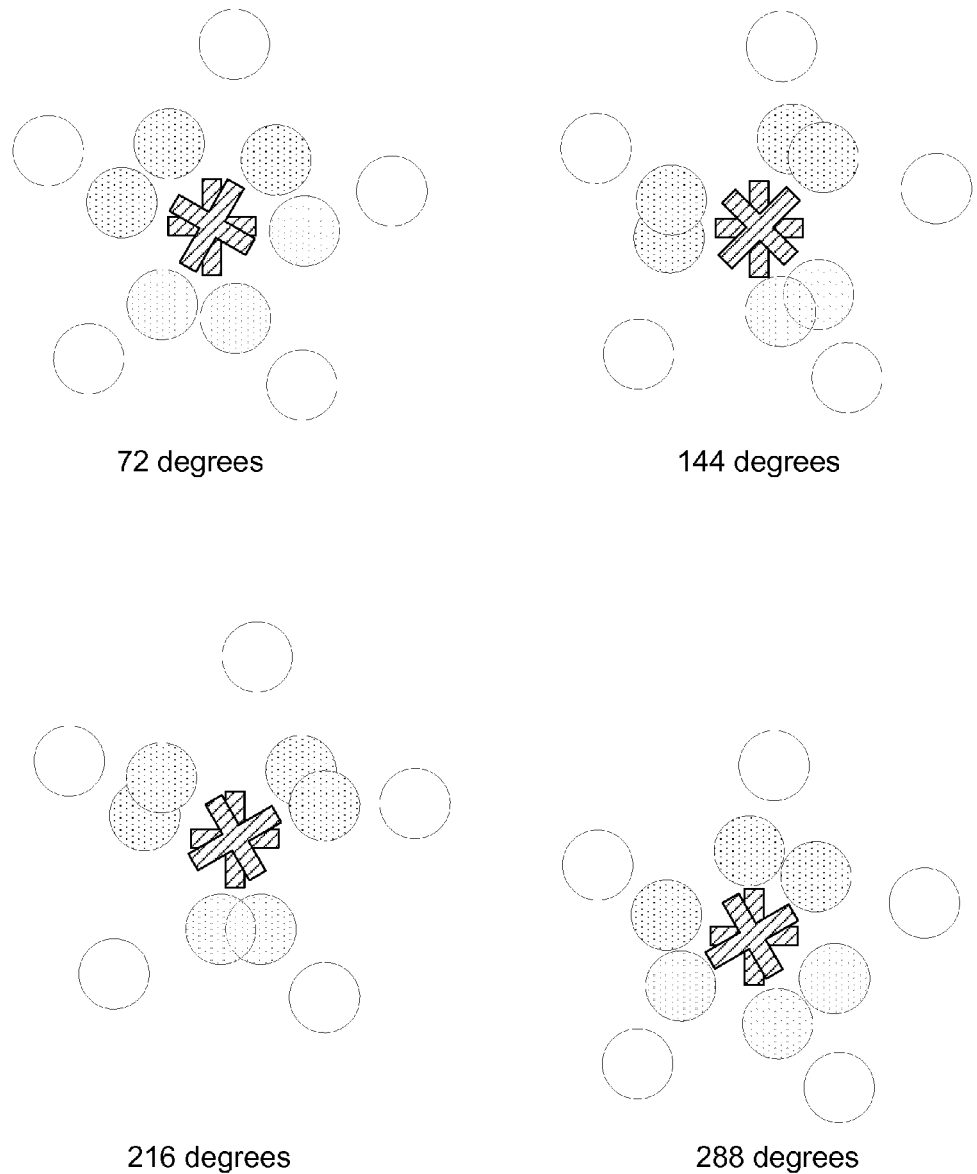
FIG. 10 illustrates a process for averaging the COS determinations for the first layer structures of FIG. 2 at 72°, 216°, 144° and 288°.

The above target examples can be used to determine overlay while achieving a substantial reduction of cross-talk to tolerable levels. For each layer of structures, cross-talk interference of the other layers can further be suppressed by averaging over the different rotation angles for the layer structures that are being analyzed. FIG. 8 illustrates a process for averaging the results of determining COS for the third layer structure 406 at rotation angles of 90°, 180° and 270°. In this example, the cross-talk interference from first layer structures 402a-402e and second layer structures 404a-404c can be minimized. Likewise, FIG. 9 illustrates a process for averaging the results for determining COS for the second layer structures 404a-404c at 120° and 240°. Similarly, FIG. 10 illustrates a process for averaging the COS determinations for the first layer structures 402a-402e at 72°, 144°, 216°, and 288°.

Additionally, cross-talk may be minimized by carefully selecting placement and sizing of the different layer structures so that correlation or cross-talk is substantially reduced or eliminated when another layer's rotational COS is being determined. For instance, the first layer structures can be sized and placed so that there is no correlation for rotational angles pertaining to another layer structures' invariance. As shown in FIG. 9, the rotated first layer structures do not overlap with the unrotated first layer structures for the rotational angles of 120° and 240° for the second layer structures 404a-404c. Since there is no overlap, the first layer structures do not introduce any cross-talk for determining the COS for the second layer structures. Similarly in FIG. 10, the second layer structures are placed and sized so as to not overlap at 72° and 288°, for which the first layer structures are invariant. Accordingly, no cross-talk is introduced for determining the COS for the first layer structures as well. Thus, a COS of the first layer structures will not be biased by the second layer structures, and vice versa, so that first layer vs. second layer overlay will likely be accurate. Should optics introduce some point spread function, some cross-talk can appear. However, by reducing the radii of the circles (or other size metric for other shapes), one can eliminate this cross-talk once again.

Figure 11:
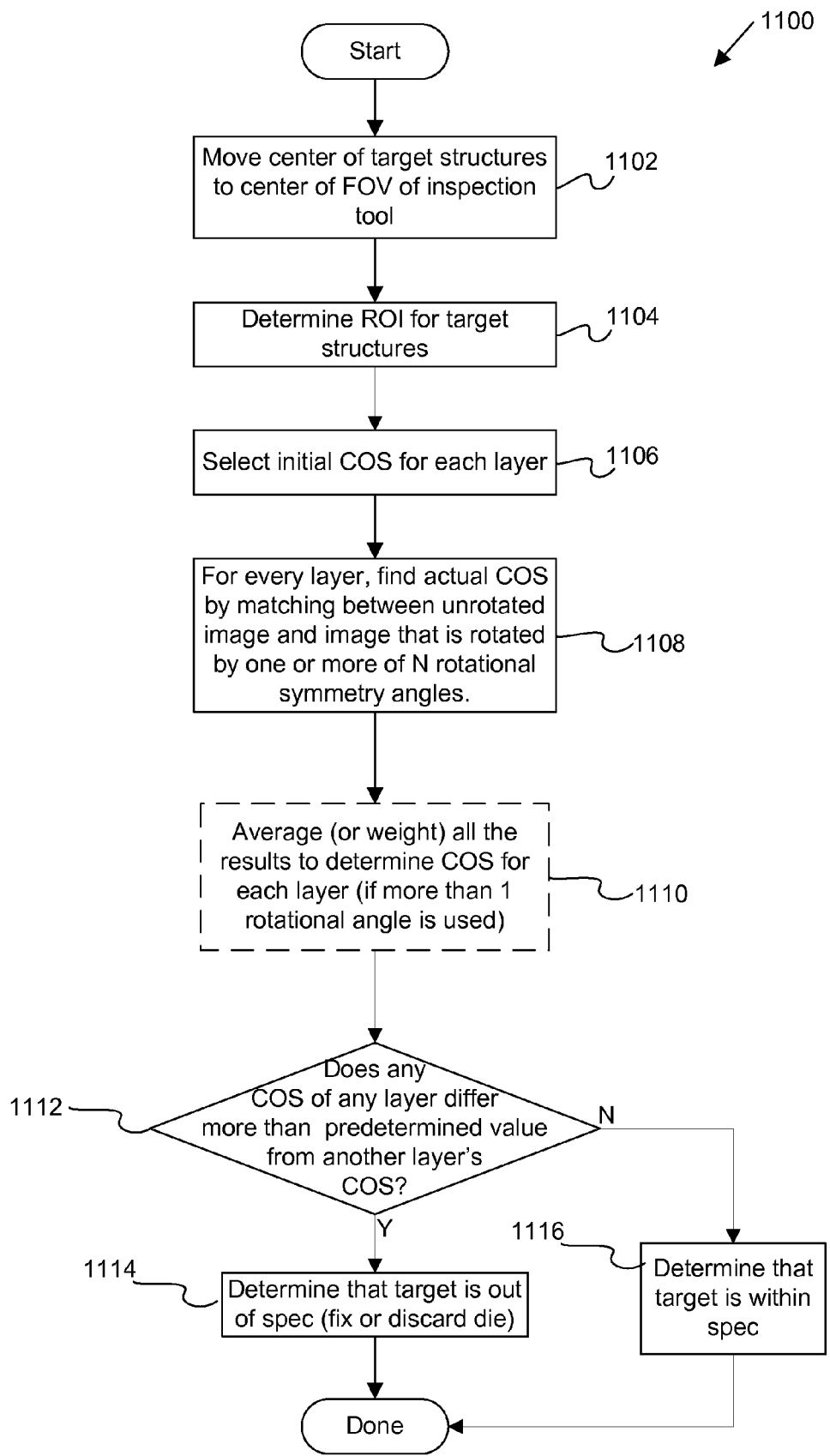
FIG. 11 is a flow chart illustrating a process for determining overlay in accordance with a specific implementation of the present invention.

FIG. 11 is a flow chart illustrating a process 1100 for determining overlay in accordance with a specific implementation of the present invention. Initially, the center of the target structures is moved to the center of the field of view (FOV) of the inspection tool in operation 1102. Of course, if the structures of the different layers are designed to have offset COS's, with some COS's being not located in the center of the target, this operation can be skipped.

The region of interest (ROI) may then be determined for the target structures in operation 1104. For instance, the ROI may be defined to encompass all the structures of the target. Alternatively, multiple ROI's can be defined for each structure of each different layer structures. In the example of FIG. 4, a ROI may be defined around the entire target 400 or around each circle structure (402a-402e, 404a-404c) and the center cross structure (406).

The initial rotational center of symmetry (COS) can then be selected for each layer in operation 1106. For example, the center of the FOV may initially be defined as the COS for each layer of structures. For each layer, the actual rotational COS of each layer can be found by matching the unrotated image and one or more images that are rotated one or more N rotational symmetry angles in operation 1108. The number N of rotated images can be from one to M−1, where M is the degree of rotational symmetry of the particular layer. In the example of FIG. 4, the first layer (with features 402a-e) has 5 degrees (or 5-fold) degree of rotational symmetry, the second layer (with features 404a-c) has 3 degrees (or 3-fold) rotational symmetry, and the third layer (having feature 406) has 4 degrees (or 4-fold) rotational symmetry. For each layer, the rotated and unrotated images can be generally moved with respect to each other and different COS's until the best correlation is found between the unrotated and rotated images, by way of example implementation. The COS for a particular layer that results in the best correlation can be defined as the COS for the particular layer. Optionally, if more than one rotational angle is used (more than one rotated image) for a particular layer, all the results to determine COS for such layer may be averaged or weighted using any suitable factors in operation 1110.

After all the COS's are determined for each layer of structures, it may then be determined whether any COS of any layer differs from another layer's COS by more than a predetermined value in operation 1112. If there is no significant difference (more than the predetermined value), it may be determined that the target is within specification in operation 1116. For example, it may be determined that there is no or minimal overlay error between the different layer structures.

If a COS difference is found to be more than the predetermined value, it can then be determined that the target is out of specification in operation 1114. That is, significant overlay error is present between two or more layer of structures. When a significant overlay error is found, the die can be either discarded or repaired. If a process is out of specification, a number of techniques may be implemented to alleviate the problem. In a first technique, a subsequent process may be adjusted to compensate for the process which is out of specification. For example, if it is determined that the photoresist pattern is misaligned in any portion, the photoresist may then be stripped and reapplied in a corrected pattern to eliminate the misalignment.

The target structures illustrated and described herein are merely exemplary. The structures for different layers may have the same or different shapes, such as circles, crosses, polygons, bars, lines, etc. Additionally, the target structures may be formed so that overlay can be determined in either the x and y direction. That is, a first set of target structures may be designed for determination of overlay error in the x direction, while a second of target structures can be designed for overlay determination in the y direction. Of course, target structures can also be designed for both x and y direction overlay determination.

Targets having predefined symmetry characteristics may be in the form of device structures. In other words, device structures which have different inherent symmetrical properties for each layer may be used. These structures may also have a known offset between their COS's. Such devices may be identified by the designer and identified by tags in the design layout. Alternatively, such "target" devices may be located manually or automatically after fabrication.

The target is designed to follow specific target rules, which preferably include a requirement that the target be placed in a layer which is measurable or inspectable by a particular type of tool. For example, the target may have to be on a top layer or be covered with only optically transparent layers so that the target may be inspected by an optical tool. In other applications, the target may be required to be underneath an opaque layer so that the opaque layer's conformance to the underlying target may be inspected and/or measured. Additionally, each inspection, review, or metrology tool typically has a size constraint as to the measured or inspected structure. That is, structures below a particular size cannot be seen. Therefore, the targets must be sized so that they can be measured or inspected by the relevant tool.

The targets of the present invention described herein may be placed in any suitable space on the wafer. By way of examples, the targets may be placed in the scribe line or within the dies themselves. When targets are placed in a die, the die layout may also be analyzed to determine whether particular portions or areas have a characteristic which negatively or positively affects metrology or inspection results, as compared with other areas of the die layout. For example, particular layout characteristics may result in more reliable or accurate metrology or inspection results. In one specific case, targets may be placed in areas which have characteristics that positively affect the metrology or inspection. In an example of such a feature characteristic, a chemical mechanical polishing (CMP) procedure is typically tuned to achieve superior accuracy with a particular feature density range. Thus, targets, such as overlay targets, may be placed in layout regions which are within the particular feature density range for an optimal CMP process.

The circuit designer may be aware of feature locations in the die layout which are most susceptible to error or defects. The designer may communicate the position of such features to the target placement software or layout engineer so that targets may be placed proximate to such problem features. This placement technique would likely result in a higher incidence of defect capture and more reliable resulting products.

The targets may also be placed within a dummy layer. It is common practice in semiconductor manufacturing today to include dummy structures in open areas of the circuit layout to ensure uniform pattern density. Dummy structures are generally used for optimal results in chemical mechanical polishing and other semiconductor manufacturing processes.

In order to enable targets inside the chip area, the functionality of the particular metrology (or inspection) target may be combined with the purpose of the dummy structures. That is, a structure which has two components that serve both purposes of a dummy structure and a metrology (or inspection) target would efficiently utilize the open spaces of the die area to increase CMP uniformity (and other dummy requirements where applicable), as well as to provide a metrology or inspection target. Additionally, a new type of metrology or inspection may be used with such combination marks. For example, a particular design pattern's fidelity may be monitored via such combination target. That is, a designer's intent regarding a particular pattern's function or structure may be verified with respect to the pattern being combined and measured or inspected in a dummy structure.

A combination target and dummy structure can be achieved in a number of different ways. An overlay type combination and dummy structure includes two components one on a first layer or mask and one on a second layer or mask. Each component preferably complies with the requirements for a dummy structure of the process step associated with that layer or mask. A further example may be a case where these structures are aligned such that the component on a first mask is symmetrically positioned with respect to the component on a second mask when the masks are correctly aligned. Also, the component on a first mask may be designed to fit into the open spaces within the component on a second mask and visa versa.

When the FOV includes both targets and devices, it is first determined which parts of the signal are noise (or device structures) and which parts correspond to the target structures. This determination may be determined in suitable manner. In one embodiment, the signal (or image generated from such signal) is compared to a design file which identifies device structures and the device structures' contribution to the signal (or image) is subtracted from the signal (or image). The resulting signal (or image) corresponds to the target which may then be assessed as previously described. Alternatively, one may manually train the metrology tool to locate targets by manually moving the tool to known target locations and identifying the targets. These identified targets can then be used by the metrology tool to search for other targets with a similar appearance using standard pattern recognition techniques. Alternatively, a representative target in the design file may be used to train the metrology tool. The representative target may also be located in a easily found position, such as the scribe line.

In general, rules for both dummy structures and the particular target type are followed when forming combination dummy and target structures. For instance, the dummy structure rules may require a particular pattern density or maximum open space size for ensuring a particular level of CMP uniformity. Additionally, the particular metrology or inspection procedure rules for the targets are followed. In one type of overlay metrology technique, the structures on two different layers are assessed to determine whether their centers of symmetry are where they should be (e.g., aligned or offset by a known distance) to thereby determine overlay. In this example, the structures are designed on two different layers and have a same center of symmetry or known offset centers of symmetry.

Typically, no significant empty (free of pattern) areas are allowed in modern processes. Unpatterned areas can be filled by dummification structures such that those structures would not introduce any significant cross-talk, when two-dimensional processing is to be used for overlay calculation. One remedy may be to use very deep sub-resolution dummification pitches, so that dummified areas are perceived or measured as "gray" unpatterned ones. Furthermore, tool optics can be designed in a way that dummification pattern is even more suppressed.

The techniques of the present invention may be implemented in any suitable combination of software and/or hardware system. Regardless of the system's configuration, it may employ one or more memories or memory modules configured to store data, program instructions for the general-purpose inspection operations and/or the inventive techniques described herein. The program instructions may control the operation of an operating system and/or one or more applications, for example. The memory or memories may also be configured to store layout patterns, layout constraint rules and target rules.

Because such information and program instructions may be employed to implement the systems/methods described herein, the present invention relates to machine readable media that include program instructions, state information, etc. for performing various operations described herein. Examples of machine-readable media include, but are not limited to, magnetic media such as hard disks, floppy disks, and magnetic tape; optical media such as CD-ROM disks; magneto-optical media such as floptical disks; and hardware devices that are specially configured to store and perform program instructions, such as read-only memory devices (ROM) and random access memory (RAM). The invention may also be embodied in a carrier wave traveling over an appropriate medium such as airwaves, optical lines, electric lines, etc. Examples of program instructions include both machine code, such as produced by a compiler, and files containing higher level code that may be executed by the computer using an interpreter.

Figure 12:
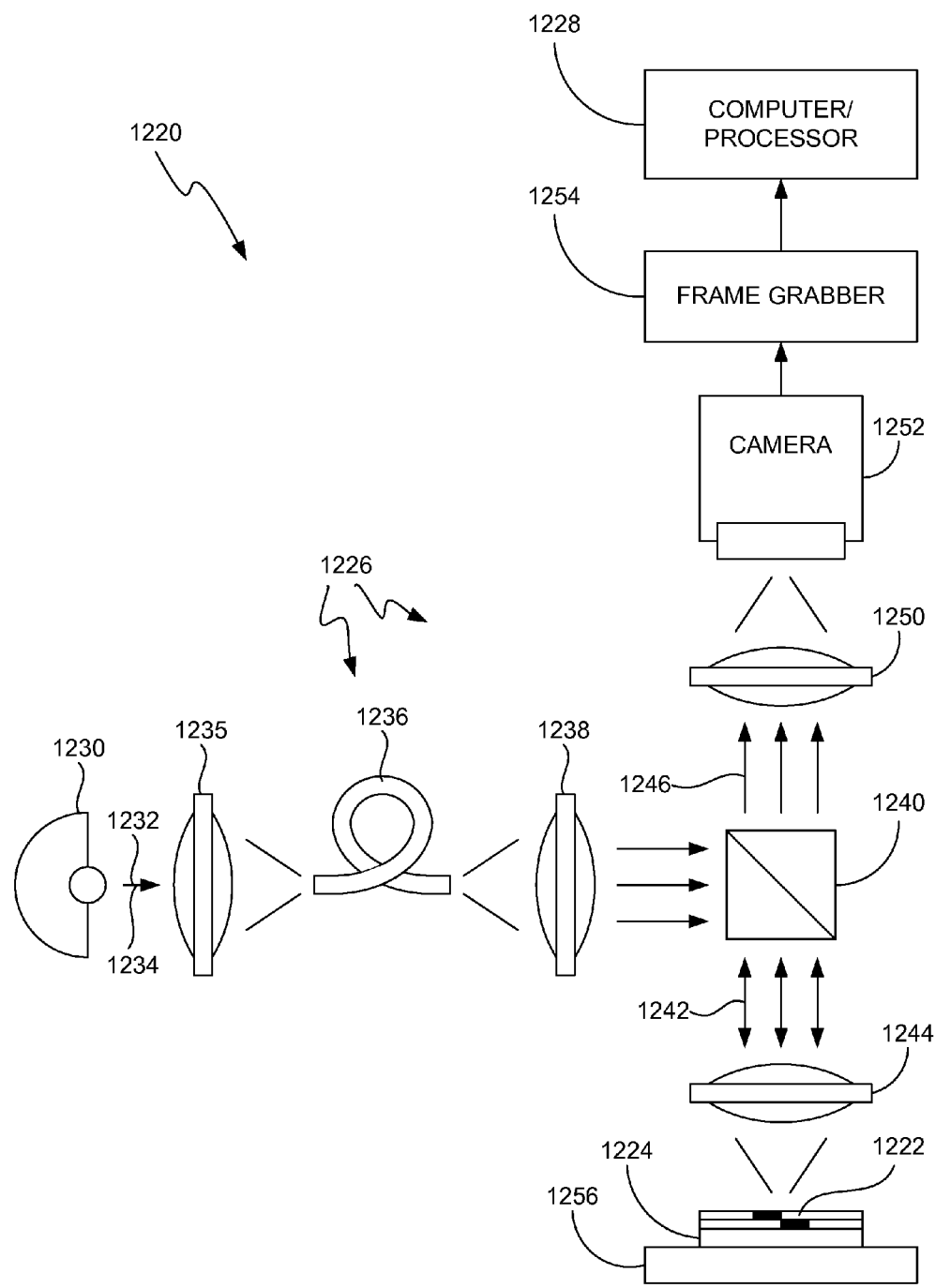
FIG. 12 is a simplified diagram of an overlay measurement system or metrology tool that may be used to determine, via imaging, overlay in any of the marks described herein.

FIG. 12 is a simplified diagram of an overlay measurement system or metrology tool 1220 that may be used to measure overlay in any of the marks described above via imaging. Imaging is a very developed technology with large user acceptance, and components that are readily available to the user. As is generally well known, imaging is an effective way to collect a large amount of information at any one time. That is, all points within the mark may be observed simultaneously. Furthermore, imaging allows a user to see what is actually being measured on the wafer. The dimensions of various components are exaggerated to better illustrate this embodiment.

The overlay measurement system 1220 can be arranged to determine overlay error via one or more overlay targets 1222 disposed on a wafer 1224. In some cases, the overlay targets 1222 can be positioned within the scribe lines of the wafer 1224. As is generally well known, scribe lines are the areas of the wafer used for sawing and dicing the wafer into a plurality of dies. It should be noted, however, that this is not a limitation and that the position of the targets may vary according to the specific needs of each device design. For example, the designer of the semiconductor device may choose to insert overlay targets inside the area of the active devices. As shown, the overlay measurement system 1220 includes an optical assembly 1226 and a computer system 1228 having a processor and one or more memory devices. The optical assembly 1226 is generally arranged to capture the images of the overlay target 1222. The computer, on the other hand, is generally arranged to calculate the relative displacement of the elements of the overlay target from the captured images.

In the illustrated embodiment, the optical assembly 1226 generally includes a light source 1230 (e.g., incoherent or coherent, although incoherent is generally preferred) arranged to emit light 1232 along a first path 1234. The light 1232 is made incident on a first lens 1235, which focuses the light 1232 onto a fiber optic line 1236 configured to pass the light 1232 there through. When the light 1232 emerges from fiber optic line 1236, it then passes through a second lens 1238, which is arranged to image the end of the optical fiber 1236 to a suitable optical plane in the optical system, such as the entrance pupil of the objective lens 1244. The light 1232 then continues on its path until it reaches a beam splitter cube 1240, which is arranged to direct the light onto a path 1242. The light 1232 continuing along path 1242 is made incident on an objective lens 1244, which relays the light 1232 onto the wafer 1224.

The light 1232, which reflects off of the wafer 1224, is then collected by the objective lens 1244. As should be appreciated, the reflected light 1232 that is collected by the objective lens 1244 generally contains an image of a portion of the wafer 1224, as for example, the image of the overlay target 1222. When the light 1232 leaves the objective 1244, it continues along path 1242 (upward in FIG. 12) until it reaches the beam splitter cube 1240. In general, the objective lens 1244 manipulates the collected light in a manner that is optically reverse in relation to how the incident light was manipulated. That is, the objective lens 1244 re-images the light 1232 and directs the light 1232 towards the beam splitter cube 1240. The beam splitter cube 1240 is arranged to direct the light 1232 onto a path 1246. The light 1232 continuing on path 1246 is then collected by a tube lens 1250, which focuses the light 1232 onto a camera 1252 that records the image of the wafer 1224, and more particularly the image of the target 1222. By way of example, the camera 1252 may be a charge couple device (CCD), a two-dimensional CCD, or linear CCD array. In most cases, the camera 1252 transforms the recorded image into electrical signals, which are sent to the computer 1228. After receiving the electrical signals, the computer 1228 performs analysis using algorithms that calculate the overlay error of the image as described above.

The system 1220 may further include a frame grabber 1254 that works with the computer 1228 and the camera 1252 to grab images from the wafer 1224. Although the frame grabber 1254 is shown as a separate component, it should be noted that the frame grabber 1254 may be part of the computer 1228 and/or part of the camera 1252. The function of the frame grabber 1254 is generally to convert the signals from camera 1252 into a form usable by the computer 1228. The overlay metrology event can be divided into two functions—target acquisition and image grab. During target acquisition, the frame grabber 1254 and computer 1228 cooperate with a wafer stage 1256 to place the target in focus and to position the target as closes as possible to the center of the field of view (FOV) of the metrology tool. In most cases, the frame grabber grabs a plurality of images (e.g., not the images used to measure overlay) and the stage moves the wafer between these grabs until the target is correctly positioned in the X, Y and Z directions. As should be appreciated, the X&Y directions generally correspond to the field of view (FOV) while the Z direction generally corresponds to the focus. Once the frame grabber determines the correct position of the target, the second of these two functions is implemented (e.g., image grab). During image grab, the frame grabber 1254 makes a final grab or grabs so as to capture and store the correctly positioned target images, i.e., the images that are used to determine overlay.

After grabbing the images, information is extracted from the grabbed images to determine the overlay error. Various algorithms may then be used to determine the registration error between various layers of a semiconductor wafer. For example, a frequency domain based approach, a space domain based approach, Fourier transform algorithms, zero-crossing detection, correlation and cross-correlation algorithms and others may be used.

The above techniques are described by way of example and have been tested and have demonstrated good performance. Other alternative algorithmic methods for calculation of overlay include other variations of auto & cross correlation techniques, error correlation techniques, error minimization techniques, such as minimization of absolute difference, minimization of the square of the difference, threshold based techniques including zero cross detection, and peak detection. There are also dynamic programming algorithms which can be used for searching for the optimal matching between two one-dimensional patterns. As mentioned above, the analysis algorithms and approaches may be utilized with respect to all of the various overlay marks described in the previous section.

Importantly, it should be noted that the above diagram and description thereof is not a limitation and that the overlay image system may be embodied in many other forms. For example, it is contemplated that the overlay measurement tool may be any of a number of suitable and known imaging or metrology tools arranged for resolving the critical aspects of overlay marks formed on the surface of the wafer. By way of example, overlay measurement tool may be adapted for bright field imaging microscopy, darkfield imaging microscopy, full sky imaging microscopy, phase contrast microscopy, polarization contrast microscopy, and coherence probe microscopy. It is also contemplated that single and multiple image methods may be used in order to capture images of the target. These methods include, for example, single grab, double grab, single grab coherence probe microscopy (CPM) and double grab CPM methods. These types of systems, among others, are readily available commercially. By way of example, single and multiple image methods may be readily available from KLA-Tencor of San Jose, Calif. Non-imaging optical methods, such as Scatterometry, may be contemplated, as well as non-optical methods such as SEM (Scanning Electron Microscope) and non-optical stylus-based instruments, such as AFM (Atomic Force Microscope) or profilometers.

The structures and sub-structures described herein are generally patterned using suitable photolithographic techniques, and the lithographic patterns are subsequently transferred to other materials and layers using established processing techniques such as etching and deposition. In the simplest application, the transferred patterns constitute etched or deposited lines or vias. For example, the structures and sub-structures may be formations of photoresist material, recessed cavity formations, embedded trenches and/or other structures within a wafer layer. The structures and sub-structures formed by cavities may be cavities formed in any of the layers during the semiconductor fabrication process. For example, the cavities may be formed in the photoresist layer, the dielectric material layer, or the metal layers. It should be noted that the above processes are not a limitation and that any suitable fabrication technique may be used.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

What is claimed is:

1. A semiconductor target for determining overlay error, if any, between two or more successive layers of a substrate or between two or more separately generated patterns on a single layer of a substrate, the target comprising:
   a plurality of first structures that are invariant for a plurality of first rotation angles with respect to a first center of symmetry (COS) of the first structures; and
   a plurality of second structures that are invariant for a plurality of second rotation angles with respect to a second COS of the second structures,
   wherein the first rotation angles differ from the second rotation angles such that the first structures are invariant without the second structures being invariant at the first rotation angles and such that the second structures are invariant without the first structures being invariant at the second rotation angles, wherein the first structures and the second structures are formed on different layers of the substrate or separately generated patterns on a same layer of the substrate.

2. A wafer comprising the target of claim 1 and further comprising a plurality of dummy structures that fill areas around the target's first and second structures so as to substantially eliminate empty areas near the target, and wherein the dummy structures have a density that causes the dummy structures to be measured as an unpatterned area so as to reduce cross-talk in determining overlay error in the target.

3. The target of claim 1, wherein the first and second COS are designed to be the same when there is no significant overlay error between the first and second structures.

4. The target of claim 1, wherein the first and second COS are designed to have a predefined offset when there is no significant overlay error between the first and second structures.

5. The target of claim 1, wherein the first structures have a size and position such that there is no correlation between the first structures when rotated by the second rotation angles, and the second structures have a size and position such that there is no correlation between the second structures when rotated by the first rotation angles.

6. The target of claim 1, wherein the first structures at a first one of the second rotation angles does not overlap with the first structures at a second one of the second rotation angles, and wherein the second structures at a first one of the first rotation angles does not overlap with the second structures at a second one of the first rotation angles.

7. A method for determining overlay error, if any, between two or more successive layers of a substrate or between two or more separately generated patterns on a single layer of a substrate, the method comprising:

acquiring an image of a plurality of first structures that are designed to be invariant for a plurality of first rotation angles with respect to a first center of symmetry (COS) of the first structures and of a plurality of second structures that are designed to be invariant for a plurality of second rotation angles with respect to a second COS of the second structures, wherein the first rotation angles differ from the second rotation angles such that the first structures are invariant without the second structures being invariant at the first rotation angles, and such that the second structures are invariant without the first structures being invariant at the second rotation angles and wherein the first structures and the second structures are formed on different layers of the substrate or separately generated patterns on a same layer of the substrate;

determining the first COS of the first structures based on rotating the image by the first rotation angles and determining the second COS of the second structures based on rotating the image by the second rotation angles; and comparing the determined first and second COS to determine whether there is an overlay error between the first and second structures that is out of specification.

8. The method of claim 7, wherein the image is defined as an unrotated image and determining the first COS comprises:

automatically placing a rotated first image of the unrotated image that has been rotated a selected one of the first rotation angles with respect to an initial first COS; and moving the rotated first image and the unrotated image with respect to each other and different COS's until a best correlation and final COS is found between the first structures in the unrotated image and the rotated first image, wherein the final COS is determined to be the first COS, wherein determining the second COS comprises:

automatically placing a rotated second image of the unrotated image that has been rotated a selected one of the second rotation angles with respect to an initial second COS; and moving the rotated second image and the unrotated image with respect to each other and different COS's until a best correlation and final COS is found between the second structures in the unrotated image and the rotated second image, wherein the final COS is determined to be the second COS.

9. The method of claim 8, further comprising:

for each one of the first rotation angles and for the first structures, repeating the operations for automatically placing and moving and averaging the final COS's together; and for each one of the second rotation angles and for the second structures, repeating the operations for automatically placing and moving and averaging the final COS's together.

10. The method of claim 8, wherein the first and second structures are sized and positioned with respect to each other so as to substantially eliminate cross-talk and overlap of the unrotated image and the rotated first and second images when determining the COS for another one of the first or second structures.

11. The method of claim 7, wherein an overlay error is determined when the first COS differs from the second COS by more than a predetermined amount.

12. A method of manufacturing a semiconductor target for determining overlay error, if any, between two or more successive layers of a substrate or between two or more separately generated patterns on a single layer of a substrate, comprising:

forming a plurality of first structures of a target that are invariant for a plurality of first rotation angles with respect to a first center of symmetry (COS) of the first structures; and forming a plurality of second structures the target that are invariant for a plurality of second rotation angles with respect to a second COS of the second structures, wherein the first rotation angles differ from the second rotation angles such that the first structures are invariant without the second structures being invariant at the first rotation angles and such that the second structures are invariant without the first structures being invariant at the second rotation angles, wherein the first structures and the second structures are formed on different layers of the substrate or separately generated patterns on a same layer of the substrate.

13. An apparatus for determining overlay error, if any, between two or more successive layers of a substrate or between two or more separately generated patterns on a single layer of a substrate, the apparatus comprising:

an optical assembly for acquiring an image of a plurality of first structures that are designed to be invariant for a plurality of first rotation angles with respect to a first center of symmetry (COS) of the first structures and of a plurality of second structures that are designed to be invariant for a plurality of second rotation angles with respect to a second COS of the second structures, wherein the first rotation angles differ from the second rotation angles such that the first structures are invariant without the second structures being invariant at the first rotation angles and such that the second structures are invariant without the first structures being invariant at the second rotation angles and wherein the first structures and the second structures are formed on different layers of the substrate or separately generated patterns on a same layer of the substrate;

at least one memory; and at least one processor, wherein the at least one memory and processor are configured for performing the following operations:

determining the first COS of the first structures based on rotating the image by the first rotation angles and determining the second COS of the second structures based on rotating the image by the second rotation angles; and comparing the determined first and second COS to determine whether there is an overlay error between the first and second structures that is out of specification.

14. The apparatus of claim 13, wherein the image is defined as an unrotated image and determining the first COS comprises:

automatically placing a rotated first image of the unrotated image that has been rotated a selected one of the first rotation angles with respect to an initial first COS; and moving the rotated first image and the unrotated image with respect to each other and different COS's until a best correlation and final COS is found between the first structures in the unrotated image and the rotated first image, wherein the final COS is determined to be the first COS, wherein determining the second COS comprises:

automatically placing a rotated second image of the unrotated image that has been rotated a selected one of the second rotation angles with respect to an initial second COS; and moving the rotated second image and the unrotated image with respect to each other and different COS's until a best correlation and final COS is found between the second structures in the unrotated image and the rotated second image, wherein the final COS is determined to be the second COS.

15. The apparatus of claim 14, wherein the at least one memory and processor are further configured for performing the following operations:

for each one of the first rotation angles and for the first structures, repeating the operations for automatically placing and moving and averaging the final COS's together; and for each one of the second rotation angles and for the second structures, repeating the operations for automatically placing and moving and averaging the final COS's together.

16. The apparatus of claim 13, wherein a plurality of dummy structures fill areas around the first and second structures so as to substantially eliminate empty areas near the target, and wherein the dummy structures have a density that causes the dummy structures to be measured as an unpatterned area in the image so as to reduce cross-talk in determining overlay error between the first and second structures.

17. The apparatus of claim 13, wherein the first and second COS are designed to be the same when there is no significant overlay error between the first and second structures.

18. The apparatus of claim 13, wherein the first and second COS are designed to have a predefined offset when there is no significant overlay error between the first and second structures.

19. The apparatus of claim 13, wherein the first structures have a size and position such that there is no correlation between the first structures when rotated by the second rotation angles, and the second structures have a size and position such that there is no correlation between the second structures when rotated by the first rotation angles.

20. The apparatus of claim 13, wherein the first structures at a first one of the second rotation angles does not overlap with the first structures at a second one of the second rotation angles, and wherein the second structures at a first one of the first rotation angles does not overlap with the second structures at a second one of the first rotation angles.

21. The apparatus of claim 13, wherein the optical assembly is further configured for acquiring an image of a plurality of third structures that are invariant for a plurality of third rotation angles with respect to a third COS of the third structures, wherein the third structures, first structures, and the second structures are formed on different layers of the substrate or separately generated patterns on a same layer of the substrate, and wherein the at least one memory and processor are configured for performing the following operations:

determining the third COS of the third structures based on rotating the image by the third rotation angles; and comparing the determined first, second, and third COS to determine whether there is an overlay error between the first, second, or third structures that is out of specification.

22. A semiconductor target for determining overlay error, if any, between two or more successive layers of a substrate or between two or more separately generated patterns on a single layer of a substrate, the target comprising:

a plurality of first structures that are invariant for a plurality of first rotation angles with respect to a first center of symmetry (COS) of the first structures;

a plurality of second structures that are invariant for a plurality of second rotation angles with respect to a second COS of the second structures, wherein the first rotation angles differ from the second rotation angles, wherein the first structures and the second structures are formed on different layers of the substrate or separately generated patterns on a same layer of the substrate; and a plurality of third structures that are invariant for a plurality of third rotation angles with respect to a third COS of the third structures, wherein the third structures, first structures, and the second structures are formed on different layers of the substrate or separately generated patterns on a same layer of the substrate.

23. The target of claim 22, wherein the third rotation angles are the same as the first rotation angles.

* * * * *